(12) United States Patent
Sacher

(10) Patent No.: US 11,431,266 B2
(45) Date of Patent: Aug. 30, 2022

(54) PIEZOMOTOR HAVING AN OSCILLATING HOUSING

(71) Applicant: ASPRE AG, Appenzell (CH)

(72) Inventor: Friedrich-Josef Sacher, Hamburg (DE)

(73) Assignee: ASPRE AG, Appenzell (CH)

( * ) Notice: Subject to any disclaimer, the term of this patent is extended or adjusted under 35 U.S.C. 154(b) by 135 days.

(21) Appl. No.: 16/485,866

(22) PCT Filed: Feb. 7, 2018

(86) PCT No.: PCT/EP2018/053083
§ 371 (c)(1),
(2) Date: Aug. 14, 2019

(87) PCT Pub. No.: WO2018/149714
PCT Pub. Date: Aug. 23, 2018

(65) Prior Publication Data
US 2020/0059169 A1  Feb. 20, 2020

(30) Foreign Application Priority Data
Feb. 14, 2017 (DE) .......................... 102017102884.6

(51) Int. Cl.
*H02N 2/10* (2006.01)
*H02N 2/00* (2006.01)
*H02N 2/14* (2006.01)

(52) U.S. Cl.
CPC ............. *H02N 2/101* (2013.01); *H02N 2/009* (2013.01); *H02N 2/145* (2013.01)

(58) Field of Classification Search
CPC ........ H02N 2/101; H02N 2/009; H02N 2/145; H02N 2/123; H01L 41/04; H01L 41/0833
See application file for complete search history.

(56) References Cited

U.S. PATENT DOCUMENTS

| 5,079,471 A | 1/1992 | Nygren |
| 5,473,215 A | 12/1995 | Luthier |
| 2010/0019620 A1* | 1/2010 | Kastl ..................... H01L 41/273 310/311 |
| 2013/0147315 A1* | 6/2013 | Sacher ................... H02N 2/101 310/323.02 |

FOREIGN PATENT DOCUMENTS

| CN | 1111020 A | 11/1995 |
| CN | 101499738 A | 8/2009 |
| CN | 103181071 A | 6/2013 |
| DE | 94 19 802 U1 | 4/1996 |
| JP | H 10-233537 A | 9/1998 |
| JP | 2012 200050 A | 10/2012 |
| WO | WO 2012/022443 A1 | 2/2012 |
| WO | WO 2015/036545 A2 | 3/2015 |
| WO | WO 2015/036545 A3 | 3/2019 |

* cited by examiner

*Primary Examiner* — Emily P Pham
(74) *Attorney, Agent, or Firm* — Muirhead and Saturnelli, LLC

(57) ABSTRACT

A piezoelectric motor may include a stator, a rotor rotating about a rotational axis and at least one piezoelectric element driving the rotor and maintained by the stator. Mechanical reliability and performance levels of a piezoelectric motor may be increased in that the at least one piezoelectric element may be mounted in an oscillating housing that oscillates with respect to the stator about the pivot axis.

15 Claims, 11 Drawing Sheets

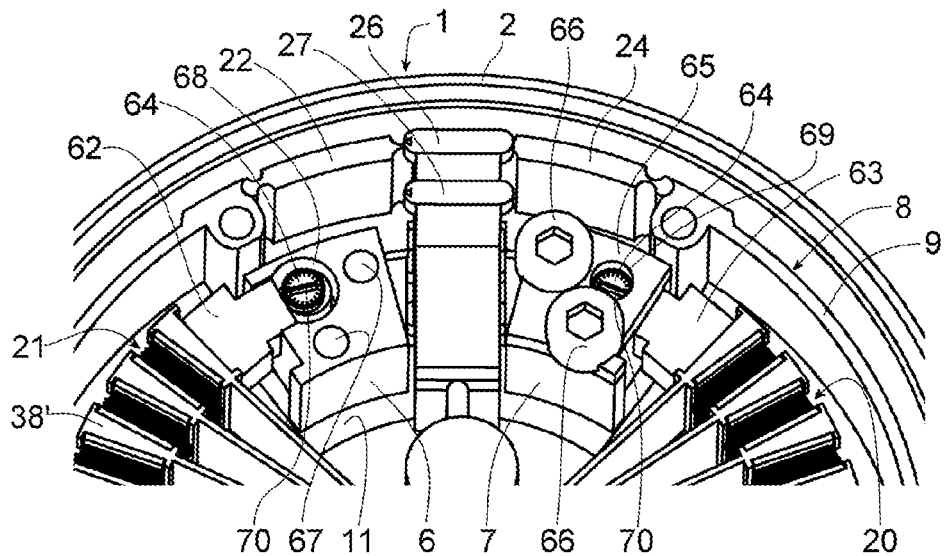
FIG. 15
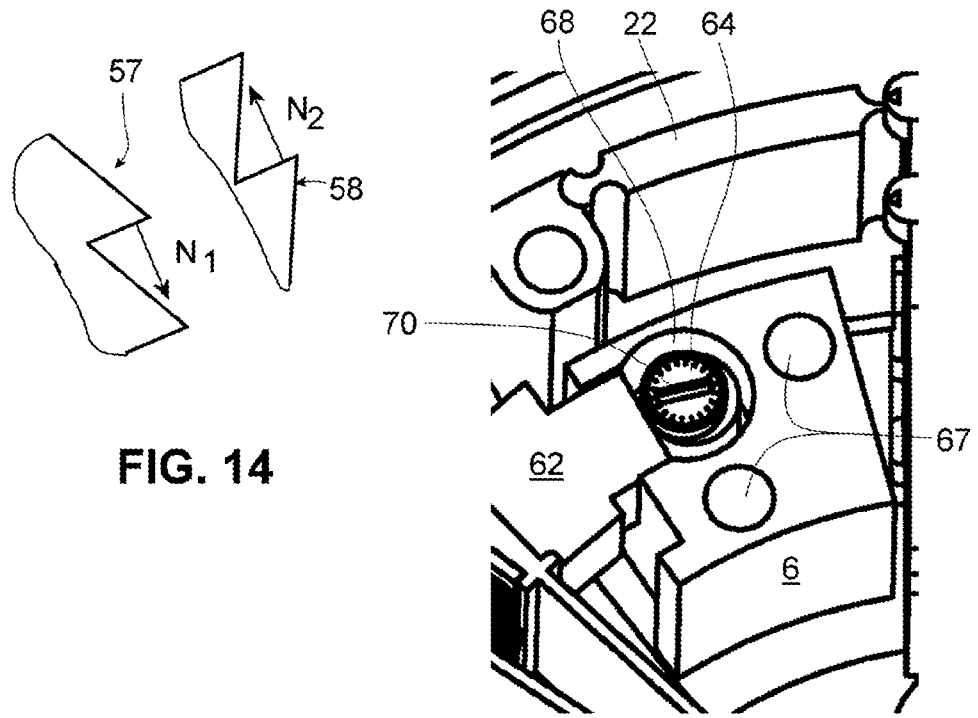
FIG. 14
FIG. 16

PIEZOMOTOR HAVING AN OSCILLATING HOUSING

TECHNICAL FIELD

The system described herein relates to a piezomotor including a stator, a rotor which rotates about a rotation axis, and at least one piezoelement which is held by the stator and drives the rotor.

BACKGROUND OF THE INVENTION

A piezomotor including a stator, a rotor which rotates about a rotation axis, and at least one piezoelement which is held by the stator and drives the rotor is known from WO 2012/022443 A1. Here, the piezoelement interacts with a driving finger which, by way of its free end, moves a driver jaw which can be pressed against an inner annular surface of the rotor.

It may be desirable to increase the mechanical reliability and performance of such a piezomotor.

SUMMARY OF THE INVENTION

Described herein is a piezoelement—for example, a piezoelement of a piezomotor including a stator, a rotor which rotates about a rotation axis, and at least one piezoelement which is held by the stator and drives the rotor—that may be arranged in an oscillating housing which may oscillate about a pivot axis with respect to the stator.

In some embodiments, the stator may be of pot-shaped design. The oscillating housing may likewise be pot-shaped and be arranged on the stator such that it may pivot about an axis which may be parallel in relation to the rotation axis of the rotor.

In other words, the oscillating housing may have at least one disk-like covering surface.

This disk-like covering surface may provide the oscillating housing with a very high degree of rigidity. This rigidity may be necessary in order to reliably transmit the movement which may be generated by the piezocrystals to the rotor.

In some embodiments, the oscillating housing may oscillate about a pivot axis which may be parallel in relation to the rotation axis of the rotor and offset radially thereto. This arrangement may produce, as explained further below, very expedient leverage ratios when transmitting the drive movement of the piezoelements to the oscillating housing. The oscillating housing may form the force-transmitting element which may transmit the drive movement of the piezoelement to the rotor. An embodiment of a force-transmitting mechanism with which the movement of the oscillating housing is transmitted to the rotor will be discussed further below.

In some embodiments, the piezoelement may be a stack actuator. A stack actuator may include a plurality of piezoceramic layers in successive packages, wherein a respective thermally conductive plate may be arranged between two packages. The thermally conductive plates may lead to the stator and effectively dissipate the heat which may be produced in the piezoceramics.

In some embodiments, a stack actuator may, in particular, include stacked piezoceramic layers which may have, on both sides, a respective electrode and may be separated from one another by means of insulating layers, wherein piezoceramic layers, electrodes and insulating layers which may lie one on the other may have openings through which heat sinks protrude.

Heat sinks which protrude into the plate-like piezoceramic layers may be particularly effective for dissipating heat which may be produced in the interior of the piezoceramic layers. The heat sinks may be arranged on the abovementioned thermally conductive plates and dissipate heat from the interior of the stack actuators.

The thermally conductive plates may form radially extending spring arms which may be fastened to an inner ring. The inner ring may surround the rotation axis of the rotor. In this way, half-rings which may expand in the circumferential direction may be formed by stack actuators, which half-rings may be effectively held in their position by means of the radially extending thermally conductive plates and dissipate the heat inward to the shaft of the rotor and of the stator.

In some embodiments, the thermally conductive plates may have, in the contact region with the piezoceramic layers, a cross section which runs in a wedge shape from the inside outward. This wedge-shaped cross section may allow packages of piezoceramic layers with substantially parallel surfaces to be arranged along a ring or half-ring in order to generate a rotational oscillation in this way. In particular, when two stack actuators may act on the oscillating housing from two different sides, said oscillating housing may be made to oscillate by alternately applying voltage to the left-hand-side stack actuator and the right-hand-side stack actuator.

In some embodiments, a thermally conductive paste may fill the intermediate space between the openings and the heat sinks. Thermally conductive pastes are very common in semiconductor technology in order to ensure good heat transfer between heating-up semiconductors and cooling elements. In the present case, said thermally conductive pastes may ensure the dissipation of heat which may be produced in the piezoelement to the thermally conductive plates via the heat sinks.

In some embodiments, the piezoceramic layers of the stack actuator may be connected to a voltage source which applies an electrical voltage to the individual piezoceramic layers of the stack actuator with a time delay. In a practical example, each package between two thermally conductive plates may include ten piezoceramic layers. These may be individually connected to the voltage source and may have voltage applied to them successively. This may have the advantage that not all of the ceramic layers of a stack actuator may have voltage applied to them at the same time and experience a large expansion with a very high force. Rather, the ceramic layers expand in succession, so that their stroke and the force may be produced continuously and gradually. The voltage source may generate voltage pulses with a frequency of 500 kHz which lies far above the resonant frequency of the oscillating housing. In some embodiments, the frequency of the voltage pulses may be approximately ten times the resonant frequency. Therefore, it may be readily possible to produce oscillations in the resonant range, which oscillations may be caused by successively pulsed activation of the individual ceramic layers.

In some embodiments, the force-transmitting element may transmit the movement to the rotor by means of a drive system which may include at least one driver claw and one tooth system into which the driver claw may engage. A claw drive for the rotor may transmit very much higher torques since an interlocking connection may be produced between the force-transmitting element and the rotor. In the illustrative embodiments described below, the driver claws may be fastened to the oscillating housing, while the tooth system may be located on the rotor. However, it should be appreciated that the driver claws may also be fastened to the rotor and the tooth system may be on the oscillating housing.

In some embodiments, the driver claw may be of resilient design and the tooth system may include sawteeth which may have an oblique flank and a holding flank which runs substantially in the radial direction of the rotor. The driver claw may have a corresponding shape with a drive flank which, when it latches in, bears against the holding flank of the sawteeth. This may ensure a large transmission force and therefore a large torque which acts on the rotor. During the return movement of the driver claw, the oblique flank of said driver claw may slide across the corresponding oblique flank of the tooth system until the holding flank engages behind the tooth system again.

In some embodiments, a plurality of driver claws may be arranged offset in relation to one another in the circumferential direction of the rotor. Piezoelements produce only very small movements. Therefore, the oscillating housing executes only movements in the order of magnitude of 50 µm in spite of the expedient lever action which amplifies the oscillation amplitude. These movements may be too small to form an effective claw shape in these small dimensions. Instead, by way of example, two or three claws may be arranged offset in relation to one another at a distance of 50 µm in each case, wherein the tooth spacing of the tooth system with which this claw interacts may be 100 µm or 150 µm. Nevertheless, a claw may engage in the case of each oscillating movement because the latching points of said claw, specifically the positions in which the holding flanks of the claws, which holding flanks may be offset in relation to one another, engage behind the sawteeth, may be at a distance of 50 µm, that is to say at the magnitude of the oscillation amplitude, from one another.

The drive system may have two different tooth systems, wherein the surface normal of the holding flank of the first tooth system points in a first circumferential direction of the rotor and the surface normal of the holding flank of the second tooth system points in an opposite second circumferential direction of the rotor. This design may allow provision of driving by the claws in both rotation directions of the rotor.

In some embodiments, the drive system may have disengagement devices by way of which the driver claws may be disengaged from the tooth system. Owing to the disengagement devices, the claws which interact with the first tooth system and which drive the rotor in the first rotation direction may be selectively disengaged, while the claws which drive the rotor in the second rotation direction may engage into the corresponding tooth system. When the two claws are disengaged, the rotor may rotate freely about the rotation axis. When the two claws are engaged, the rotor may be fixed to the stator such that it cannot rotate.

In some embodiments, a drive disk which can rotate about the rotation axis may be arranged on both sides of the oscillating housing, at least one driver claw being fastened on said drive disk. A plurality of driver claws which may be offset in the circumferential direction may be arranged on the drive disk. A plurality of (three or four) groups of driver claws may also be arranged on the drive disk, which groups may be distributed uniformly over the circumference of the rotor and drive the rotor at different points of its circumference.

In some embodiments, the driver claws of the first drive disk may rotate the rotor in the first rotation direction and the driver claws of the second drive disk may rotate the rotor in the second, opposite rotation direction. Accordingly, the rotor may be provided, in the regions in which the driver claws may be located, with the tooth system on one side, in which regions the surface normal of the holding flanks points in the first circumferential direction. In the region of the second drive disk, the surface normals of the holding flanks of the tooth system of the rotor may point in the second circumferential direction.

As an alternative, it may be possible for one or more driver claws of each drive disk to provide a driving action in the first direction and for another or several other driver claws of the same drive disk to provide a driving action in the second direction.

A non-return device may be connected to the rotor in order to prevent the rotor from rotating backward. The rotation direction of the non-return device may have to be changeable if the drive direction of the rotor is changed by means of the disengagement device.

Since the piezoelements, even in the form of stack actuators, generate very small movement amplitudes, it may be advantageous when the piezomotor has an arrangement which eliminates the play of the piezoelement which may be supported on the stator and on the oscillating housing. This may ensure that the full force and the full travel of the extension of the piezoelement is transmitted to the oscillating housing. The arrangement may be an eccentric which may be arranged in a rotatable manner in a fastening block of the stator and the eccentric circumferential surface of which bears against a pressure element at the end of a stack actuator. By way of eliminating the play, it also may be possible to arrange a plurality of stack actuators one above the other and to allow said plurality of stack actuators to act on the same oscillating housing when it is necessary to increase the force of the piezoelements. Each stack actuator which is arranged in the piezomotor may have a separate device for eliminating the play, which device may be individually adjusted.

BRIEF DESCRIPTION OF THE DRAWINGS

Embodiments of the piezomotor will be described below with reference to the appended drawings:

FIG. 14 schematically shows a comparison of the shapes of the two internal tooth systems which are arranged on the rotor, according to an embodiment of the system described herein;

FIG. 15 shows an enlarged view of a section of the stator housing comprising the inserted oscillating housing in which the support of the stack actuators may be seen more clearly, according to an embodiment of the system described herein; and FIG. 16 shows an enlarged illustration of the fastening block against which a stack actuator is supported, according to an embodiment of the system described herein.

DESCRIPTION OF VARIOUS EMBODIMENTS

Illustrative embodiments of the system described herein will now be described in relation to the drawings. It should be appreciated that the system described herein is not limited to the following illustrative embodiments, as other embodiments, for example, variations of the following illustrative embodiments, are possible, and intended to fall within the scope of the invention.

Figure 1:
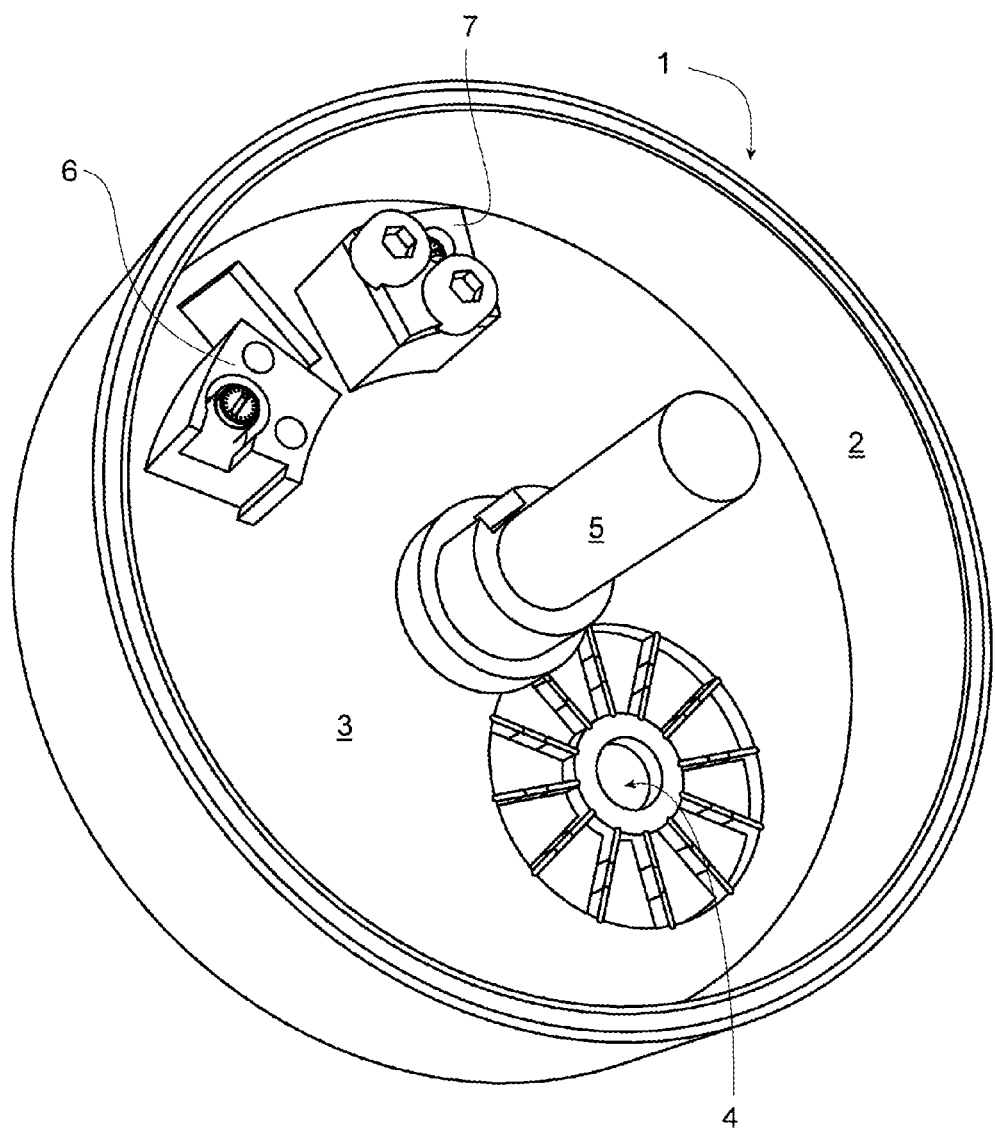
FIG. 1 shows a three-dimensional view of a stator housing of a piezomotor, according to an embodiment of the system described herein.

FIG. 1 shows a stator 1 of a piezomotor, more precisely the stator housing 1, according to an embodiment of the system described herein. The stator housing 1 may be of substantially pot-shaped design; it may have a cylindrical circumferential wall 2 and a circular disk-shaped base 3. A bearing 4 for a pivot pin 15 of the oscillating housing 8 may be arranged in the base 3. The rotation axis 5 of the rotor, called rotor shaft below, may be located in the center of the stator housing 1. Fastening blocks 6, 7, to which a respective stack actuator may be fastened, may be located diametrically opposite the bearing 4 for the oscillating housing 8.

Figure 2:
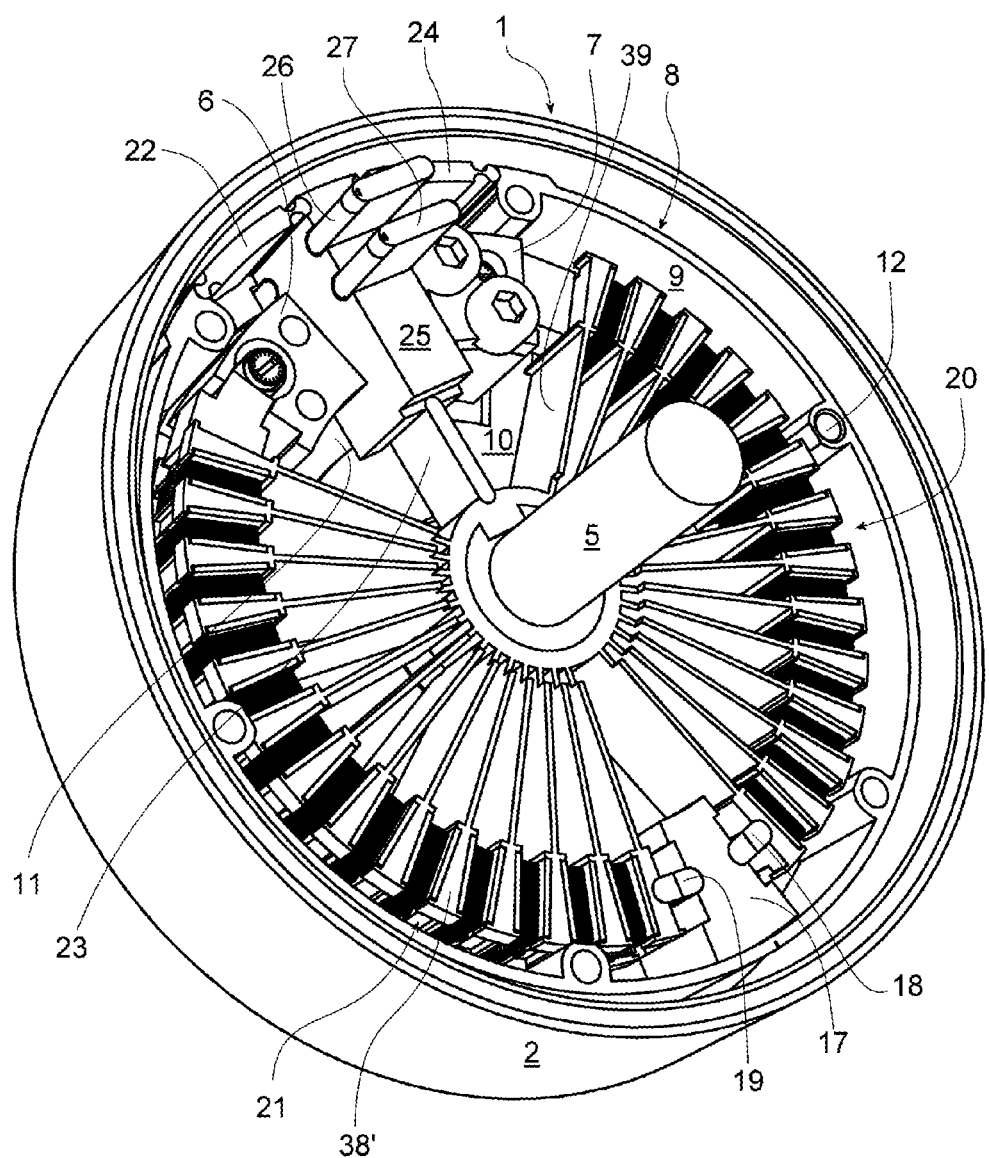
FIG. 2 shows the stator housing with an inserted oscillating housing and piezoactuators located therein, according to an embodiment of the system described herein.
Figure 3:
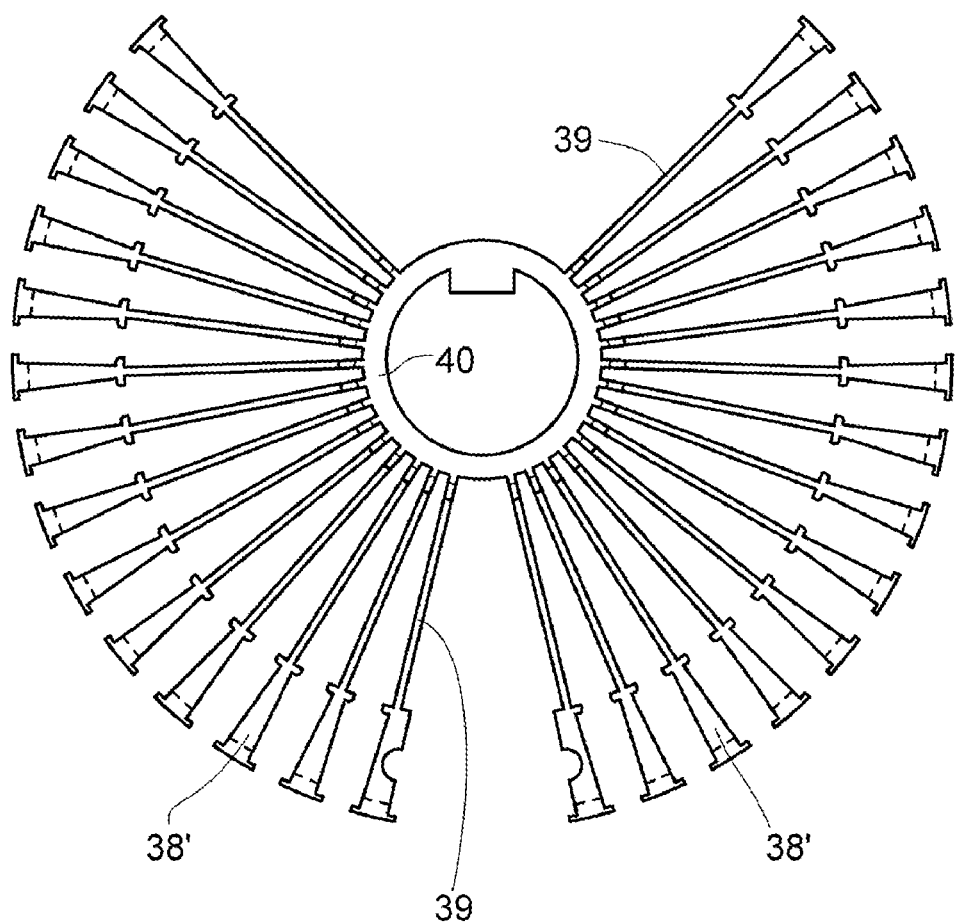
FIG. 3 shows an inner ring with radiant thermally conductive plates arranged thereon for forming two half-ring-shaped stack actuators, according to an embodiment of the system described herein.
Figure 7:
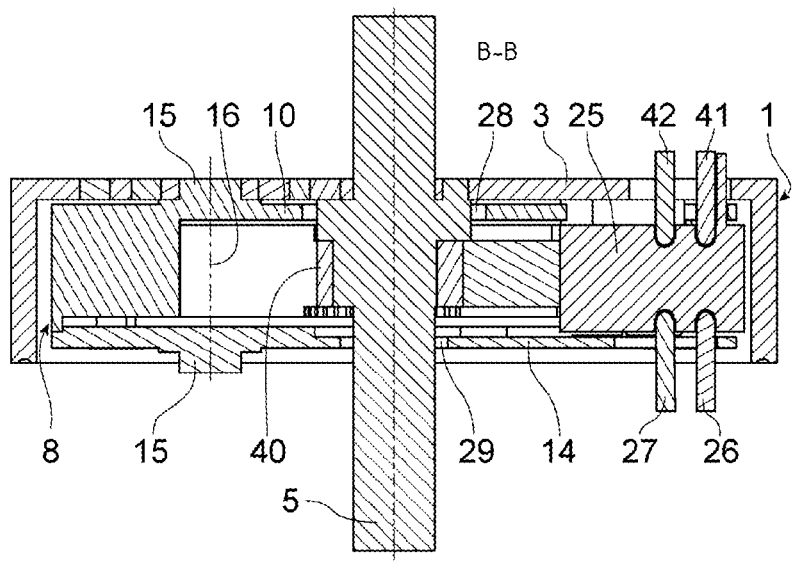
FIG. 7 shows a sectional view along the section line B-B from FIG. 6, according to an embodiment of the system described herein.
Figure 8:
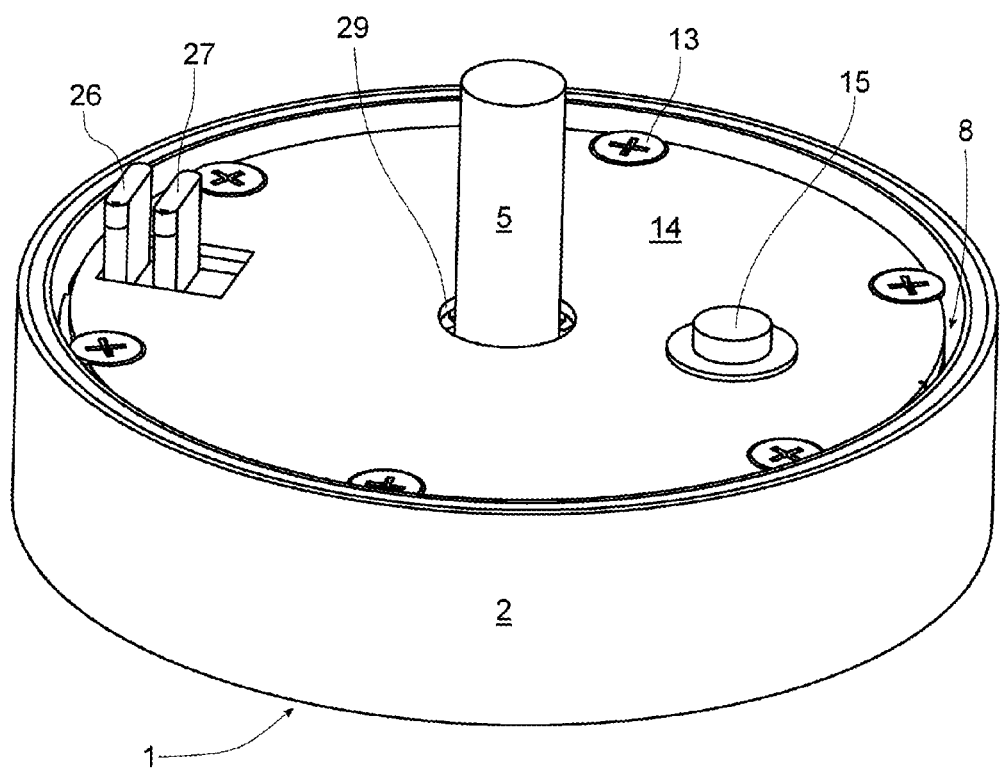
FIG. 8 shows a three-dimensional view of the stator housing comprising the oscillating housing from FIGS. 6 and 7, according to an embodiment of the system described herein.

FIG. 2 shows the stator housing 1 from FIG. 1, according to an embodiment of the system described herein, with the oscillating housing 8 inserted and the piezoactuators 20, 21 located therein, which piezoactuators form piezoelements for driving the rotor. The oscillating housing 8 also may have a pot shape with a circumferential wall 9 and a circular disk-shaped base 10. The base 10 of the oscillating housing 8 may have a window 11 through which the fastening blocks 6, 7 protrude. The fastening blocks 6, 7 serve to support the piezoactuators 20, 21. The circumferential wall 9 of the oscillating housing 8 may have an internal thread 12 for receiving fastening screws 13 (see FIG. 8) with which a circular disk-shaped cover 14 of the oscillating housing 8 may be fixedly screwed. FIG. 8 also shows that the cover 14 may have a pivot pin 15. A second pivot pin 15, which may be in alignment with the pivot pin 15 of the cover 14, may be arranged on the base 10 of the oscillating housing 8 on that side which may be averted from the piezoactuators 20, 21, as shown in FIG. 7. The two pivot pins 15 together form the pivot bearing around the pivot axis 16 of the oscillating housing 8.

FIG. 2 further shows that a force-introducing block 17 may be arranged on that side of the oscillating housing 8 which may be situated approximately diametrically opposite the fastening blocks 6, 7. The force-introducing block 17 may be fastened to the base 10 of the oscillating housing 8 and may serve to transmit force from the piezoactuators 20, 21 which may be supported on the stator by means of the fastening blocks 6, 7. The stack actuators 20, 21 may act on this force-introducing block 17 by means of flexure joints 18, 19.

As shown in FIG. 7, the pivot axis 16 may be located approximately at the radially inner end of the force-introducing block 17. The oscillating housing 8 therefore may oscillate about this pivot axis 16. The base 10 and the cover 14 of the oscillating housing 8 may have, centrally, openings 28, 29 which may surround the rotor shaft 5 with considerable radial play of more than 1 mm. These openings 28, 29 are shown in FIG. 7. This may ensure that the rotor shaft 5 does not impede the free movement of the oscillating housing 8. The movement of the oscillating housing 8 may be transmitted to a connection block 25 (see FIG. 2) with connection plates 26, 27, which may protrude out of the oscillating housing 8, by means of the circumferential wall 9 of the oscillating housing 8 and further flexure joints 22-24.

A short lever arm may be situated between the flexure joints 18, 19, by way of which the movement of the stack actuators 20, 21 may be transmitted to the force-introducing block 17, and the pivot axis 16 of the oscillating housing 8. Conversely, there may be a long lever arm between the pivot axis 16 of the oscillating housing and the connection plates 26, 27 by means of which the oscillating movement may be transmitted to the rotor. Therefore, the amplitude of the connection plates 26, 27 may be a great deal larger than the amplitude of the force-introducing block 17. This lever geometry may be achieved by way of the pivot axis of the oscillating housing running parallel in relation to the rotation axis of the rotor 53 (FIG. 10) and being radially offset in relation to the rotation axis of the rotor 53 in the direction of the point at which the piezoelements introduce force into the oscillating housing 8.

The design and the functioning of the two stack actuators 20, 21 should be clear, in particular, from FIGS. 2-6, according to embodiments of the system described herein. Each of the stack actuators 20, 21 may have thirteen packages 30 including piezoceramic layers which may be layered one above the other. The design of each package 30 is schematically illustrated as an exploded drawing in FIG. 4. Each package may include, for example, five to ten piezoceramic layers 31. A first electrode 32 may be arranged on the top side of the piezoceramic layer 31. The surface area of the first electrode 32 may correspond substantially to the surface area of the piezoceramic layer 31. A second electrode 33 may be arranged on the bottom side of the piezoceramic layer 31. Each of the electrodes 31, 32 may be followed by an insulating layer 34, so that the piezoceramic layer 31 may be individually activated by means of the electrodes 32, 33 respectively.

Figure 4:
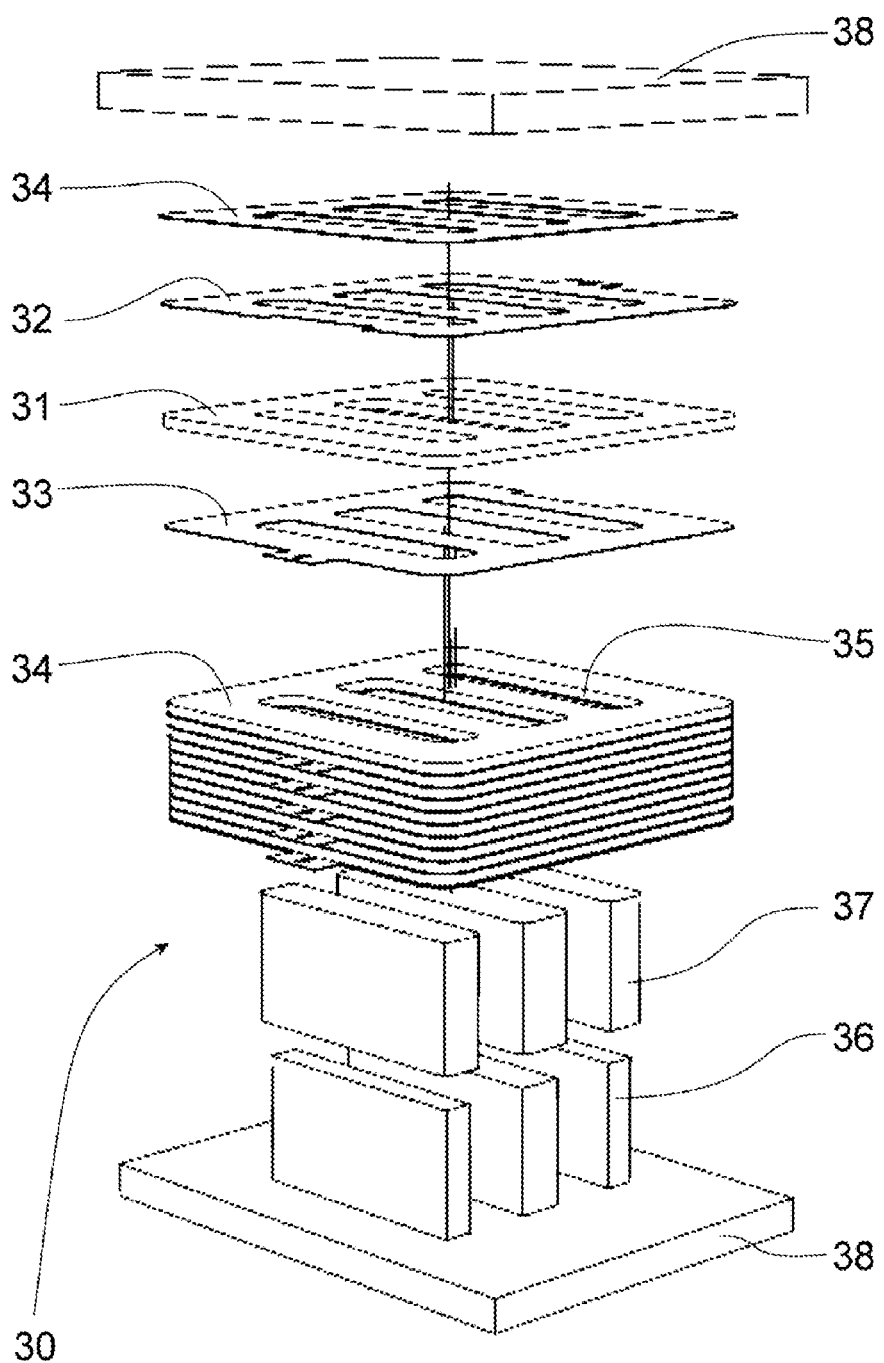
FIG. 4 shows a schematic exploded illustration of a package of piezoceramic plates between two thermally conductive plates, according to an embodiment of the system described herein.

As shown in FIG. 4, both the piezoceramic layers 31 and also the electrodes 32, 33 and the insulating layers 34 may have three openings 35 which may be in the form of elongate holes. Heat sinks 36 may protrude through the openings 35. Thermally conductive paste 37 may be arranged on each of the heat sinks 36, which thermally conductive paste may produce a good thermally conductive connection between the openings 35 and the heat sinks 36. The heat sinks 36 may be connected to a thermally conductive plate 38 at least by means of the thermally conductive paste 37, so that heat which is produced in the piezoceramic layers 31 may be dissipated by means of the thermally conductive paste 37, the heat sinks 36 and the thermally conductive plate 38. The thermally conductive plates 38 may be of planar design in the schematic illustration of FIG. 4, so that a straight stack actuator would be produced if a plurality of packages 30 were stacked one on the other. However, the stack actuators 20, 21 may have a ring shape which causes the oscillating housing 8 to oscillate in a rotational manner in the stator housing 1. In order that the central line of the stack actuators 20, 21 acquires a bent profile, the thermally conductive plates 38' may be designed with a wedge shape with a plate thickness which decreases from the outside inward. The thermally conductive plates 38' are shown, in particular, in FIGS. 2 and 3. Radially inwardly running spring arms 39, which may be fastened to a common inner ring 40, may be located adjoining the wedge-shaped outer region of the thermally conductive plates 38'. The inner ring 40 may be fastened to the stator housing 1 in the region of the rotor shaft 5.

In this way, the heat of the piezoceramic layers 31 may be conducted away by means of the thermally conductive plates 38' radially to the internal ring 40. Since the inner regions of the thermally conductive plates 38' form spring arms 39, they may be displaced in the circumferential direction. They may therefore be sufficiently deformed in order to permit expansions of the two stack actuators 20, 21 on account of the electrical voltage being applied to the piezoceramic layers 31.

If a voltage is applied to all piezoceramic layers 31 of a stack actuator 20, 21 at the same time, a very high pressure force may be produced. The dimensions of the piezostack actuator may change suddenly from the minimum to the maximum value.

Figure 5:
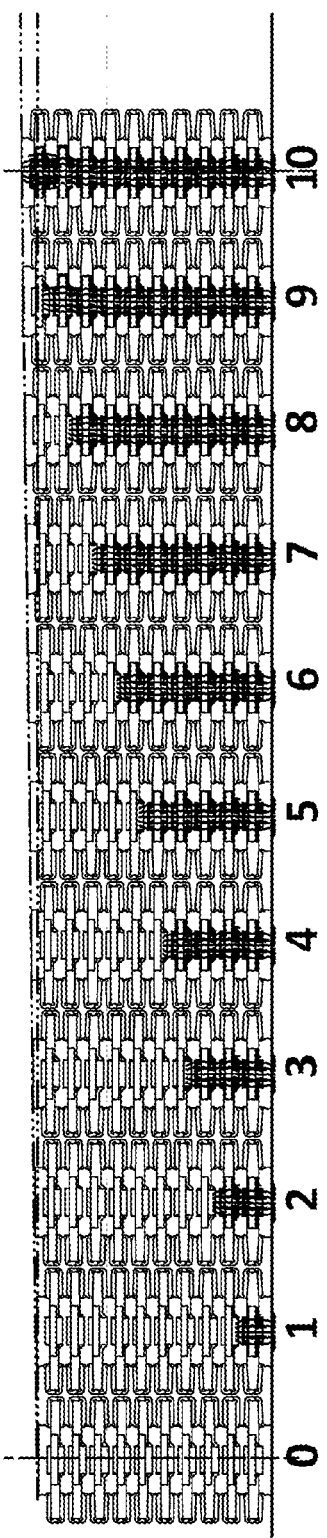
FIG. 5 schematically shows the time sequence of applying voltage to the package from FIG. 4, according to an embodiment of the system described herein.

In order to render the expansion of the stack actuators 20, 21 more gradual, voltage may be applied to the individual piezoceramic layers 31 of each package 30 of the stack actuators 20, 21 in succession in accordance with the pattern from FIG. 5.

FIG. 5 shows eleven illustrations, according to an embodiment of the system described herein, which follow one another in terms of time, of the ceramic layers of a package 30 which may be stacked one on the other, in the present case of a package comprising ten piezoceramic layers. If no voltage is applied, the package may have the smallest extent. This is shown in the left-hand-side package which is identified by the numeral 0. The numeral 1 identifies a package at a later time in which voltage is applied to the first piezoceramic layer. The other layers may be free of voltage. Therefore, the entire package may deform only by the small amount with which the one ceramic layer of the package deforms.

The illustration identified by the numeral "2" follows the illustration bearing the numeral "1" in terms of time. In "2", voltage is applied to two ceramic layers, so that the expansion of the entire package is twice that in the illustration bearing numeral "1". Accordingly, the illustration bearing numeral "3" follows the illustration "2" in terms of time and may have three piezoceramic layers to which voltage may be applied. In the illustration bearing numeral "4", voltage is applied to four piezoceramic layers, and so on. It is shown that the total expansion of the package takes place gradually and in stages over an extended period of time.

Figure 6:
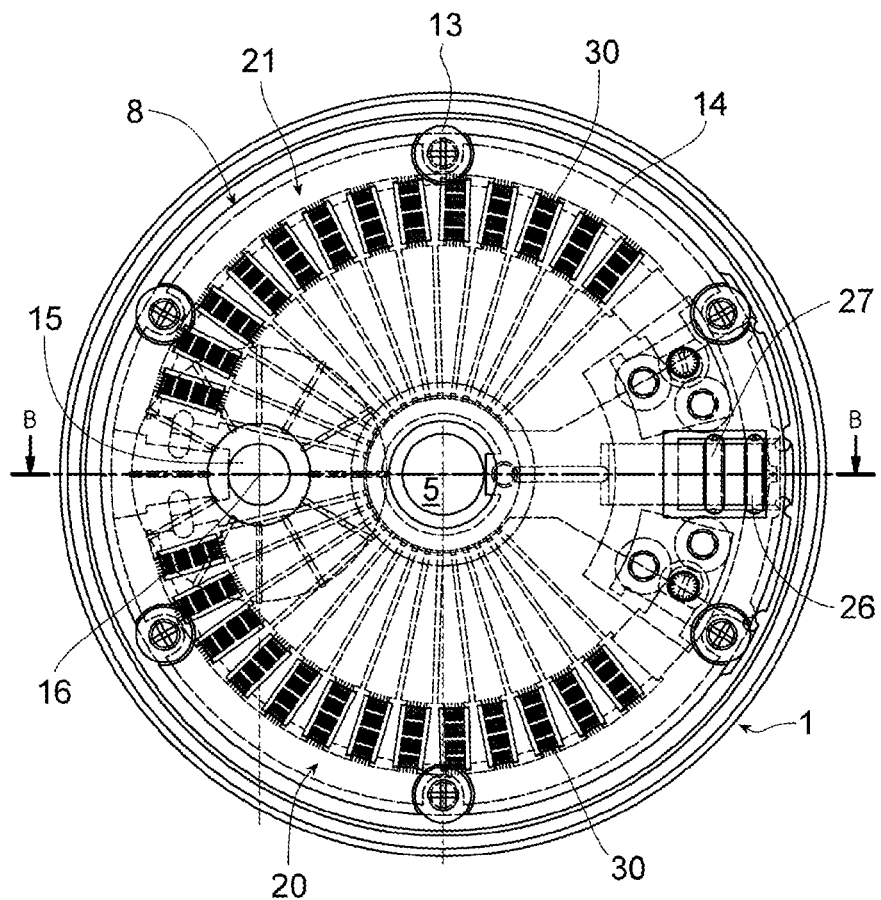
FIG. 6 shows a front view of the stator housing comprising the oscillating housing, according to an embodiment of the system described herein.

FIGS. 6 to 8 show the stator housing 1 including the oscillating housing 8 with the cover 14 screwed on, wherein the stack actuators 20, 21, which may be situated beneath the cover 14, are illustrated using dashed lines as components which are not visible, according to embodiments of the system described herein.

Here, the elements by means of which the stack actuators 21, 20 may be supported on the fastening blocks 6, 7 of the stator 1 are illustrated on an enlarged scale in FIGS. 15 and 16, according to embodiments of the system described herein. It is shown that pressure elements 62, 63, which may be composed of steel for example, may be arranged at the ends of the stack actuators 21, 20. These pressure elements 62, 63 may be supported against the fastening blocks 6, 7 of the stator by means of an adjustment mechanism which may allow fluctuations and tolerances in the dimensions of the stack actuator 20 or 21, but also in the dimensions of the stator 1 or of the oscillating housing 8, to be compensated for. In particular, FIG. 16 shows that the fastening blocks 6, 7 may have a respective bore 68 into which an eccentric 64 may be inserted. The bore 68 may be covered by way of a covering plate 65 which is illustrated on the fastening block 7 only in FIG. 15 and to which the eccentric 64 may be fixedly clamped in a rotationally fixed manner. The covering plate 65 may have an opening 69 through which an adjusting slot 70 in the end side of the eccentric 64 may be reached. The circumferential surface of the eccentric 64, which circumferential surface may be eccentric to the bearing of the eccentric in the fastening block 6 or 7, may bear against the pressure element 62 or 63. Any play between the pressure element 62 or 63 and the adjacent fastening block 6 or 7 may be compensated for by turning the eccentric 64. The covering plate 65 may fixedly clamp the eccentric 64 after the optimum position is set, by way of the closure screws 66 being tightened. As mentioned, the covering plate 65 with the opening 69, which may be fixedly screwed onto the fastening block 7 by the closure screws 66, is shown only in the right-hand-side half of FIG. 15. The covering plate with the closure screws is omitted from the fastening block 6 in the left-hand-side half. As a result, the top side of the fastening block 6 with the bore 68 for receiving the eccentric 64 and the threaded bores 67 into which the closure screws 66 may be screwed are shown.

The play compensation may be necessary in order to reliably support the small movement amplitudes of the stack actuators 21, 20 on the fastening blocks 6, 7. It is, of course, also possible to achieve the play compensation using means other than eccentrics, for example moving wedges. The play compensation also may be arranged in the region of the force-introducing block 17 (see FIG. 2) at the opposite end of the stack actuators 20, 21.

In particular, FIG. 7 shows that, on one side, connection plates 26, 27 protrude through the cover 14 and, on the other side, connection plates 41, 42 protrude through the base 3 of the stator housing 1, which connection plates may be fastened to the connection block 25 and transmit the movement of the oscillating housing 8 to the outside.

Figure 9:
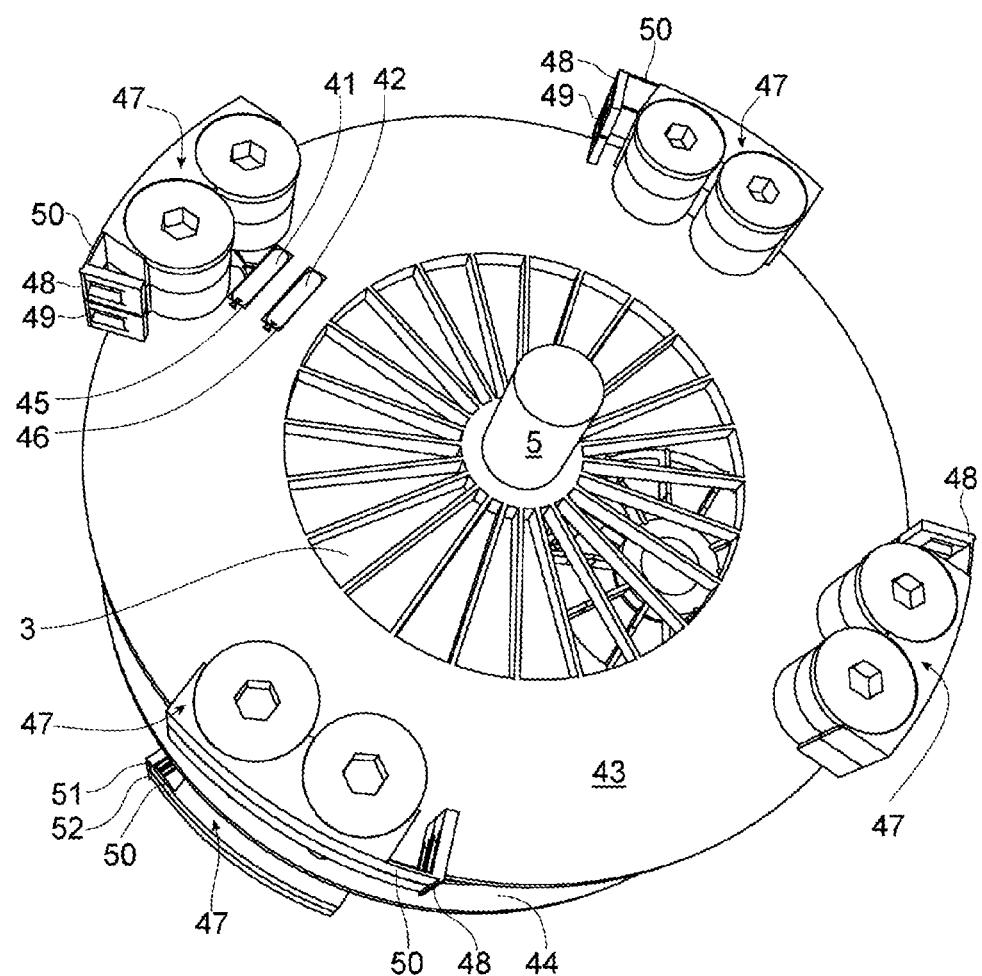
FIG. 9 shows the stator housing and the oscillating housing from FIG. 8 with drive disks which are fitted on the rotor shaft such that they may rotate, according to an embodiment of the system described herein.

FIG. 9 shows a visual illustration of the stator housing with drive disks 43, 44 fastened to it, according to an embodiment of the system described herein. The drive disk 43 rests on the base 3 of the stator housing 1. The drive disk 43 may have two cutouts 45, 46 in which the connection plates 41, 42 may be received without play in the circumferential direction. The connection plates 41, 42 transmit the oscillating movements of the oscillating housing 8 to the drive disk 43. The drive disk 44 may be held such that it can rotate about the rotor shaft 5. The drive disk 43 may be made to oscillate in a rotational manner about the rotor shaft 5 with an amplitude of approximately 50 µm by means of the connection plates 41, 42.

Four drive blocks 47 may be fixedly screwed to the drive disk 43. Each drive block 47 may have two driver claws 48, 49 which may be arranged next to one another. Each driver claw 48, 49 may be fastened to the associated drive block 47 by a leaf spring 50.

FIG. 9 shows that a second drive disk 44 may be arranged on the opposite side of the stator, which second drive disk may be likewise fastened such that it can rotate via the rotor shaft 5. Driver claws 51, 52, which may be fastened to corresponding drive blocks 47 by means of leaf springs 50, may be provided here too. The second drive disk 44 may be made to oscillate by means of the connection plates 26, 27 which protrude through the cover 14 of the oscillating housing 8.

Figure 10:
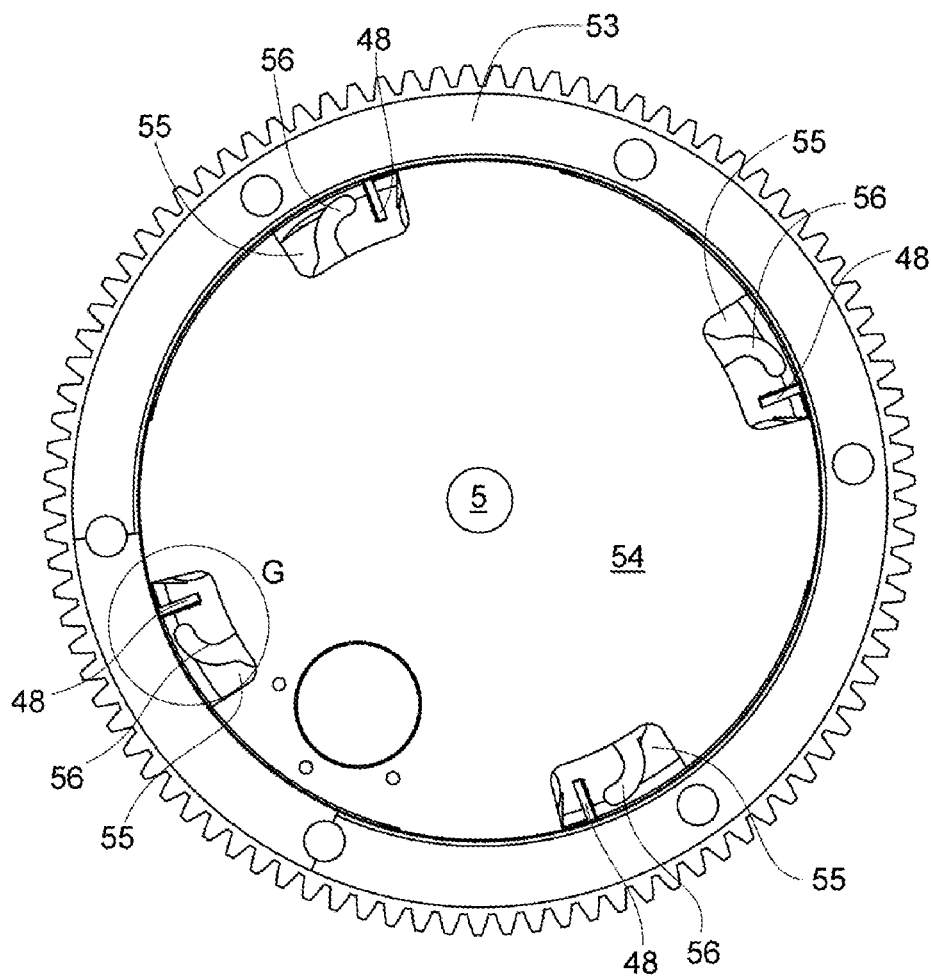
FIG. 10 shows the piezomotor with the rotor and a covering. The covering has, for illustration purposes, windows which do not have to be present in practice, according to an embodiment of the system described herein.

FIG. 10 shows a side view of the completed piezomotor, according to an embodiment of the system described herein. A rotor 53 surrounds the arrangement including the stator housing 1, the oscillating housing 8 and the two drive disks 43, 44 with the drive blocks 47. A covering 54 may be arranged within the annular rotor 53. The covering 54 may have windows 55 which may be arranged in the region of the driver claws, only the outer driver claw 48 of which can be seen in the side view. The windows 55 serve to illustrate the functioning of the motor and may be dispensed with in the actual embodiment of the motor. Disengagement devices 56 which each may interact with the closest driver claw 48 may be arranged beneath the covering 54 such that they can rotate about the rotor shaft 5. When the disengagement devices 56 may be turned in the direction of the driver claws 48, the disengagement devices 56 may lift the driver claws 48 from the internal tooth system of the rotor 53 and disengage said driver claws.

Figure 11:
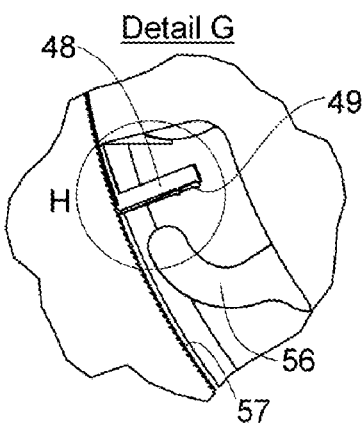
FIG. 11 shows the enlarged detail G from FIG. 10, according to an embodiment of the system described herein.

An enlarged view of the driver claw 48 and of the disengagement device 56 according to the detail G from FIG. 10 is illustrated in FIG. 11, according to an embodiment of the system described herein. It is shown that each driver claw 48, 49 may interact with an internal tooth system 57 of the rotor 53. The driver claws 48, 49 may be slightly offset in relation to one another in the circumferential direction of the rotor 53, so that a tooth of the internal tooth system 57 of the rotor 53 may always engage behind one of the two driver claws 48, 49. Therefore, the length of the tooth system may be twice as long as the oscillation amplitude, so that the latching-in of the next driver claw 48, 49 may be effected in each case by a half-movement along the tooth system.

Figure 12:
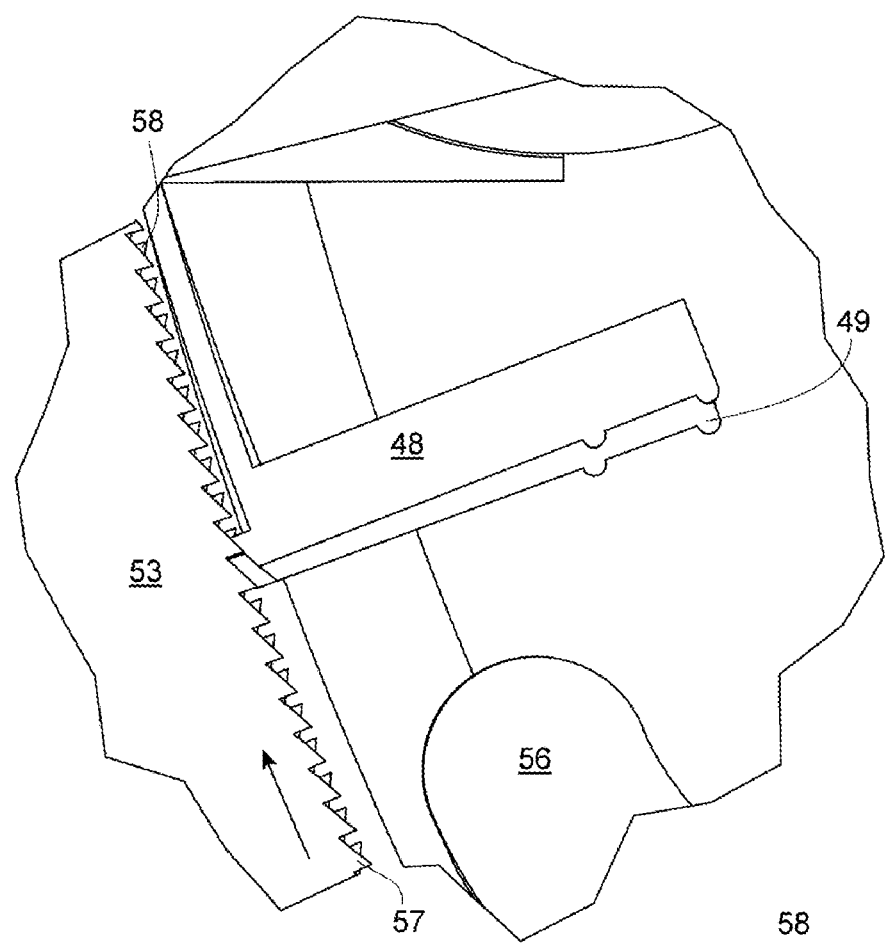
FIG. 12 shows a further enlarged illustration of the detail H from FIG. 11, according to an embodiment of the system described herein.
Figure 13:
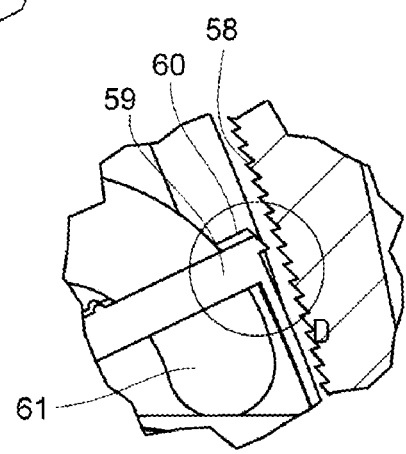
FIG. 13 shows an illustration of a drive system, which is similar to the illustration from FIG. 12, for driving in the opposite rotation direction of the rotor, according to an embodiment of the system described herein.

This is shown, in particular, in FIG. 12 according to an embodiment of the system described herein, which is once again enlarged in comparison to FIG. 11. FIG. 12 likewise shows that an internal tooth system 58, which runs in the opposite direction, may be provided. This internal tooth system may be offset in relation to the internal tooth system 57 in the axial direction of the rotor 53. The internal tooth system 58 interacts with two driver claws 59, 60. FIG. 13 shows that the driver claws 59, 60 may be pulled away from the internal tooth system 58 by the disengagement device 61. The rotation in the direction which is indicated by the arrow in FIG. 12 may not be impeded by the internal tooth system 58 of opposite orientation.

If the rotation direction is reversed, the disengagement devices 56 may have to lift the driver claws 48, 49 and the disengagement device 61 may have to release the driver claws 59, 60, so that they can pull the rotor 53 in the other direction by way of the internal tooth system 58.

FIG. 14 shows a comparison of the two tooth systems which may be arranged on the rotor 53, according to an embodiment of the system described herein. Said figure shows that each tooth system may include sawteeth which may have an oblique flank along which the driver claws slide during a relative movement with respect to the tooth system, and which may have a holding flank behind which the driver claws may engage. The holding flanks of the two tooth systems may point in opposite directions, so that their surface normals $N_1$ and $N_2$ may be directed in opposite circumferential directions of the rotor 53. In this way, the rotor may be driven in different rotation directions depending on the activation of the disengagement device 56 or 61.

In order to prevent the rotor 53 from rotating back counter to the drive direction, the rotor 53 may be held with a certain amount of friction or a permanently acting non-return device on the rotor shaft 5. It should be appreciated that the non-return device also may have to change its rotation direction when the drive direction of the rotor 53 is changed by means of the disengagement devices 56, 61.

The features of the system described herein, in the drawings and in the claims, may be essential for implementing the system described herein in its various embodiments both individually and in any desired combinations. The invention is not restricted to the embodiments described. It may be varied within the scope of the claims and taking into account the knowledge of a relevant person skilled in the art. Other embodiments of the system described herein will be apparent to those skilled in the art from a consideration of the specification and/or an attempt to put into practice the system described herein disclosed herein. It is intended that the specification and examples be considered as illustrative only, with the true scope and spirit of the invention being indicated by the following claims.

The invention claimed is:

1. A piezomotor comprising:
    a stator;
    a rotor which rotates about a rotation axis; and
    at least one piezoelement which is held by the stator and drives the rotor, wherein the at least one piezoelement is arranged in an oscillating housing which oscillates about a pivot axis with respect to the stator and wherein the oscillating housing forms a force-transmitting element which transmits drive movement of the at least one piezoelement to the rotor.

2. The piezomotor according to claim 1, wherein the pivot axis runs parallel and is radially offset in relation to the rotation axis of the rotor.

3. The piezomotor according to claim 1, wherein the at least one piezoelement is a stack actuator.

4. The piezomotor according to claim 3, wherein piezoceramic layers of the stack actuator are connected to a voltage source which applies an electrical voltage to the piezoceramic layers of the stack actuator with a time delay.

5. The piezomotor according to claim 1, wherein the force-transmitting element transmits the drive movement to the rotor by means of a drive system which includes at least one driver claw and at least one tooth system into which the at least one driver claw engages.

6. The piezomotor according to claim 5, wherein the at least one driver claw is of resilient design and the at least one tooth system includes sawteeth which have an oblique flank and a holding flank which runs substantially in a radial direction of the rotor.

7. The piezomotor according to claim 5, wherein a plurality of driver claws are arranged offset in relation to one another in a circumferential direction of the rotor.

8. The piezomotor according to claim 6 wherein the drive system has a first tooth system and a second tooth system, wherein a surface normal of holding flanks of the first tooth system points in a first circumferential direction of the rotor and a surface normal of holding flanks of the second tooth system points in an opposite, second circumferential direction of the rotor.

9. The piezomotor according to claim 7, wherein the drive system has disengagement devices by way of which the driver claws can be disengaged from the at least one tooth system.

10. The piezomotor according to claim 7, wherein a first drive disk and a second drive disk which can rotate about the rotation axis are arranged on both sides of the oscillating housing, at least one of the driver claws being fastened on the first drive disk and at least one other of the driver claws being fastened on the second drive disk.

11. The piezomotor according to claim 10, wherein driver claws fastened to the first drive disk rotate the rotor in a first direction and the driver claws fastened to the second drive disk-rotate the rotor in a second, opposite direction.

12. A piezomotor comprising:
a stator;
a rotor which rotates about a rotation axis; and
at least one piezoelement which is held by the stator and drives the rotor, wherein the at least one piezoelement is arranged in an oscillating housing which oscillates about a pivot axis with respect to the stator, wherein the at least one piezoelement is a stack actuator and wherein the stack actuator includes stacked piezoceramic layers which have, on both sides, a respective electrode and are separated from one another by means of insulating layers, wherein the stacked piezoceramic layers, electrodes and insulating layers which lie one on the other have openings through which heat sinks protrude.

13. The piezomotor according to claim 12, having at least one of the following features:
the heat sinks are arranged on thermally conductive plates;
the thermally conductive plates form radially extending spring arms which are fastened to an inner ring;
the inner ring surrounds the rotation axis of the rotor;
the thermally conductive plates have, in a contact region with the stacked piezoceramic layers, a cross section which runs in a wedge shape from the inside outward; and
a thermally conductive paste fills the intermediate space between the openings and the heat sinks.

14. A piezomotor comprising:
a stator;
a rotor which rotates about a rotation axis; and
at least one piezoelement which is held by the stator and drives the rotor, wherein the at least one piezoelement is arranged in an oscillating housing which oscillates about a pivot axis with respect to the stator and wherein the piezomotor has at least one arrangement which eliminates play of the at least one piezoelement which is supported on the stator and on the oscillating housing.

15. The piezomotor according to claim 14, wherein the at least one arrangement is an eccentric.

* * * * *